United States Patent [19]

Fujisaki et al.

[11] Patent Number: 5,535,818

[45] Date of Patent: Jul. 16, 1996

[54] COOLING SYSTEM FOR ELECTRONIC DEVICE

[75] Inventors: Akihiko Fujisaki; Hideo Katsumi, both of Kawasaki, Japan

[73] Assignee: Fujitsu Limited, Kawasaki, Japan

[21] Appl. No.: 134,947

[22] Filed: Oct. 12, 1993

[30]  Foreign Application Priority Data

Oct. 12, 1992 [JP] Japan .................................. 4-273239

[51] Int. Cl.⁶ ................................................. F28D 15/00
[52] U.S. Cl. ........................... 165/104.33; 165/104.32; 165/104.25; 165/108; 361/700; 361/699
[58] Field of Search ........................... 165/104.33, 108, 165/104.27, 104.25, 104.32, 80.4; 257/714, 715; 361/701, 700, 699, 689

[56]  References Cited

U.S. PATENT DOCUMENTS

| | | | |
|---|---|---|---|
| 3,756,903 | 9/1973 | Jones | 165/104.27 X |
| 3,774,677 | 11/1973 | Antonetti et al. | 165/104.25 X |
| 3,776,305 | 12/1973 | Simmons | 165/104.27 X |
| 3,989,102 | 11/1976 | Jaster et al. | 361/699 X |
| 4,253,518 | 3/1981 | Minesi | 165/104.27 |
| 4,327,271 | 4/1982 | Bentley et al. | 165/104.25 X |
| 4,865,123 | 9/1989 | Kawashima et al. | 165/104.33 |
| 4,897,762 | 1/1990 | Daikoku et al. | 165/80.4 X |

FOREIGN PATENT DOCUMENTS 55-26605  2/1980  Japan .

*Primary Examiner*—John Rivell
*Assistant Examiner*—Christopher Atkinson
*Attorney, Agent, or Firm*—Staas & Halsey

[57]  ABSTRACT

A cooling system for an electronic device includes a circulatory system having a pump with an inlet and an outlet for circulating a coolant in the circulatory system, a heat exchanger for cooling the coolant, a cooling module for cooling the electronic device by the coolant and a tank for reserving the coolant which is connected to the circulatory system via inflow and outflow bypass channels. The inflow bypass channel is connected to the circulatory system at a first connection node between the pump outlet and the cooling module. The outflow bypass channel is connected to the circulatory system at a second connection node between the cooling module and the pump inlet.

25 Claims, 19 Drawing Sheets

COOLING SYSTEM FOR ELECTRONIC DEVICE

BACKGROUND OF THE INVENTION

1. Field of the Invention

The present invention generally relates to cooling systems for electronic devices used in, for example, a computer using a large number of LSI devices having a high heat density, and more particularly to a cooling system in which a coolant is circulated.

2. Description of the Prior Art

Conventionally, a cooling system is used to cool electronic devices. For example, Japanese Laid-Open Patent Application No. 55-26605 discloses a cooling system for electronic devices in which a coolant is made to circulate. Particularly, the cooling system disclosed in the above application is intended to keep the pressure in a primary coolant circulatory system constant by means of a bypass connecting input and output gates of a pump. The feature of the cooling system disclosed in the above application is that it does not have a tank for reserving a coolant and the operation of pressure is based on a characteristic of variation in the delivery pressure of the pump with respect to the flow rate of the circulating coolant. However, in such a cooling system, a higher flow rate of the coolant, than that of the coolant flowing in a coolant path for cooling the electronic parts, flows in the bypass with respect to a variation in the pressure of the overall circulatory system caused by a temperature variation in the closed system. Hence, it is difficult to realize stable cooling.

SUMMARY OF THE INVENTION

It is an object of the present invention to provide an electronic device cooling system having a tank in which an increase in the pressure in a circulatory system can be suppressed.

This object of the present invention is achieved by a cooling system for an electronic device, comprising:

a circulatory system having a pump for circulating a coolant in the circulatory system, a heat exchanger for cooling the coolant, and a cooling module for cooling the electronic device by means of the coolant;

a tank for reserving the coolant;

an inflow bypass channel connected to the circulatory system at a first position between the pump and the heat exchanger; and an outflow bypass channel connected to the circulatory system at a second position between the cooling module and the pump.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1:
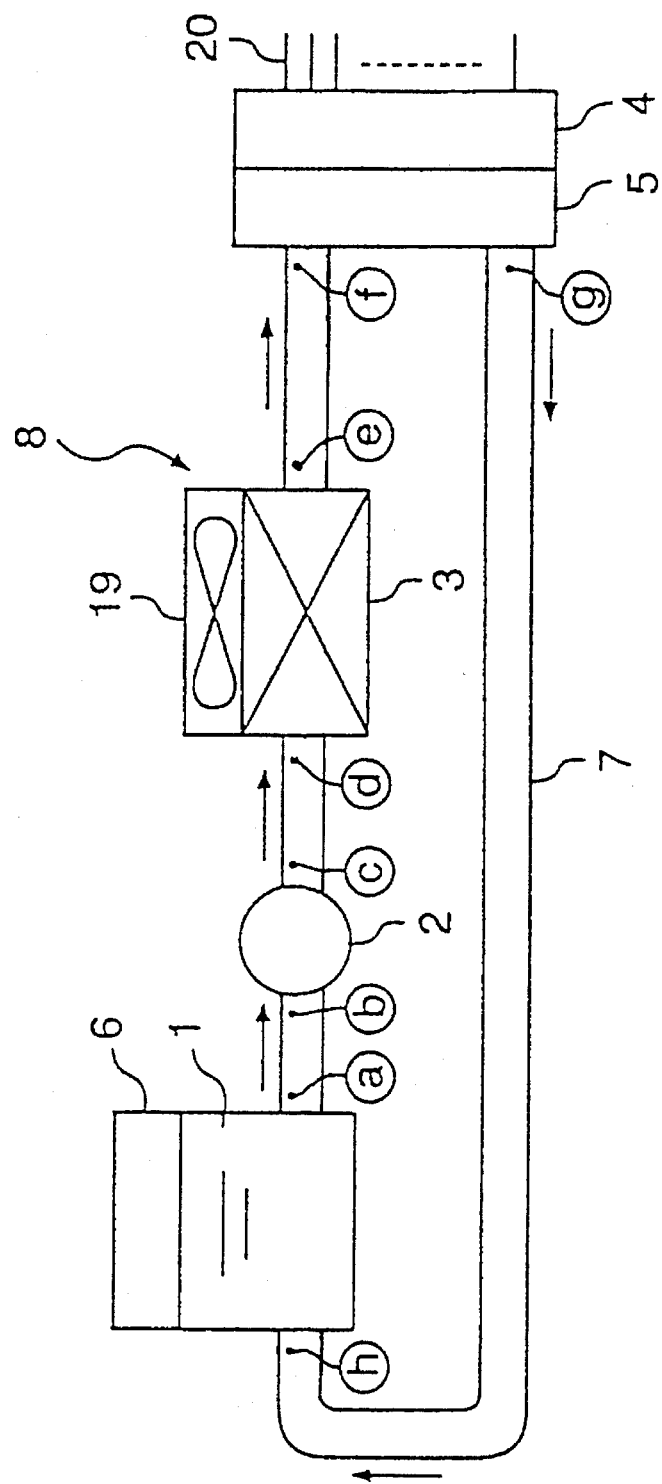
FIG. 1 is a diagram of a conventional cooling system for electronic devices.

FIG. 1 shows a conventional cooling system for an electronic device. The cooling system shown in FIG. 1 includes a circulatory system having a tank 6 for reserving and supplying a coolant 1 such as water or carbon fluoride, a pump 2 for circulating the coolant 1, a heat exchanger 3, and a cooling module 5 for directly or indirectly bringing an electronic device 4 into contact with the coolant 1. The coolant 1 is circulated in the tank 6, the pump 2, the heat exchanger 3, the cooling module 5 and the tank 6 in this order via a pipe 7. A fan 19 is used to cool the heat exchanger 3. The electronic device 4 has wiring lines 20 including power supply lines and signal lines.

The cooling module 5 and the electronic device 4 are precision parts, and it is necessary to prevent an excessive pressure from being applied thereto. In the cooling system shown in FIG. 1, the tank 6 is a part of a circulatory system 8. The pressure differences between the tank 6 and the other parts are directly based on the shape of the system 8 and the flow rate of the coolant 1 flowing in the circulatory system 8. In practice, a high pressure is applied to parts other than the tank 6.

Figure 2:
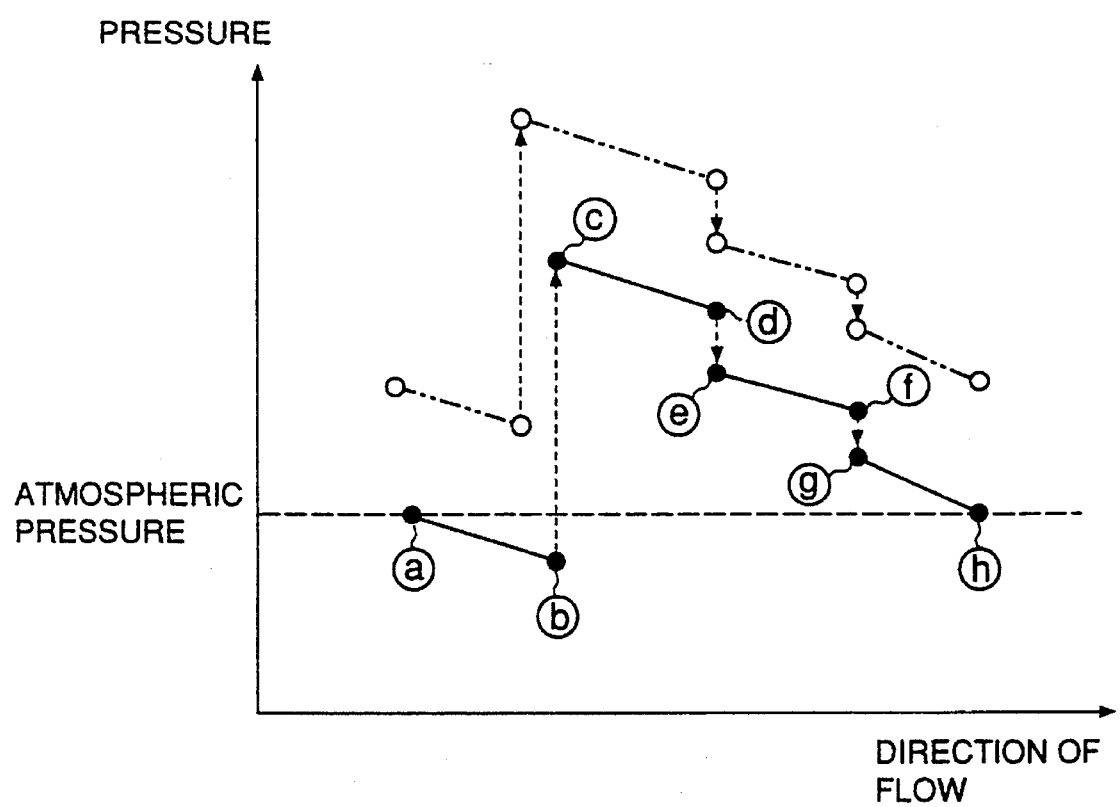
FIG. 2 is a graph of pressure distributions in the cooling system shown in FIG. 1.

More specifically, if the circulatory system 8 is a totally closed system (top of the tank 6 is totally closed), a pressure distribution as shown in FIG. 2 will be observed. In FIG. 2, the horizontal axis denotes positions in the circulatory system 8 in the direction of flow of the coolant 1, and the vertical axis denotes the pressure. In FIG. 2, a solid line is a characteristic line in an initial state, and a two-dot chained line is a characteristic line observed when the electronic device 4 generates heat and the temperature of the coolant 1 is raised. In the initial state before the coolant 1 is circulated, the pressure in the tank 6 is equal to the atmospheric pressure. Further, in FIG. 2, alphabetic labels a–h correspond to positions a–h shown in FIG. 1.

The vapor pressure of the coolant 1 is increased as the temperature of the coolant 1 reserved in the liquid state in the tank 6 rises. Hence, as will be seen from FIG. 2, the in-tank pressure is increased and the pressure in the circulatory system is also increased when the circulatory system is closed. If the circulatory system is an open system, the pressure in the tank 6 will be kept at the atmospheric pressure. In this case, it is very difficult to reduce pressure applied to the parts of the circulatory system 8, such as the cooling module 5 and so on.

The present invention is intended to suppress an increase in the pressure in the circulatory system.

Figure 3:
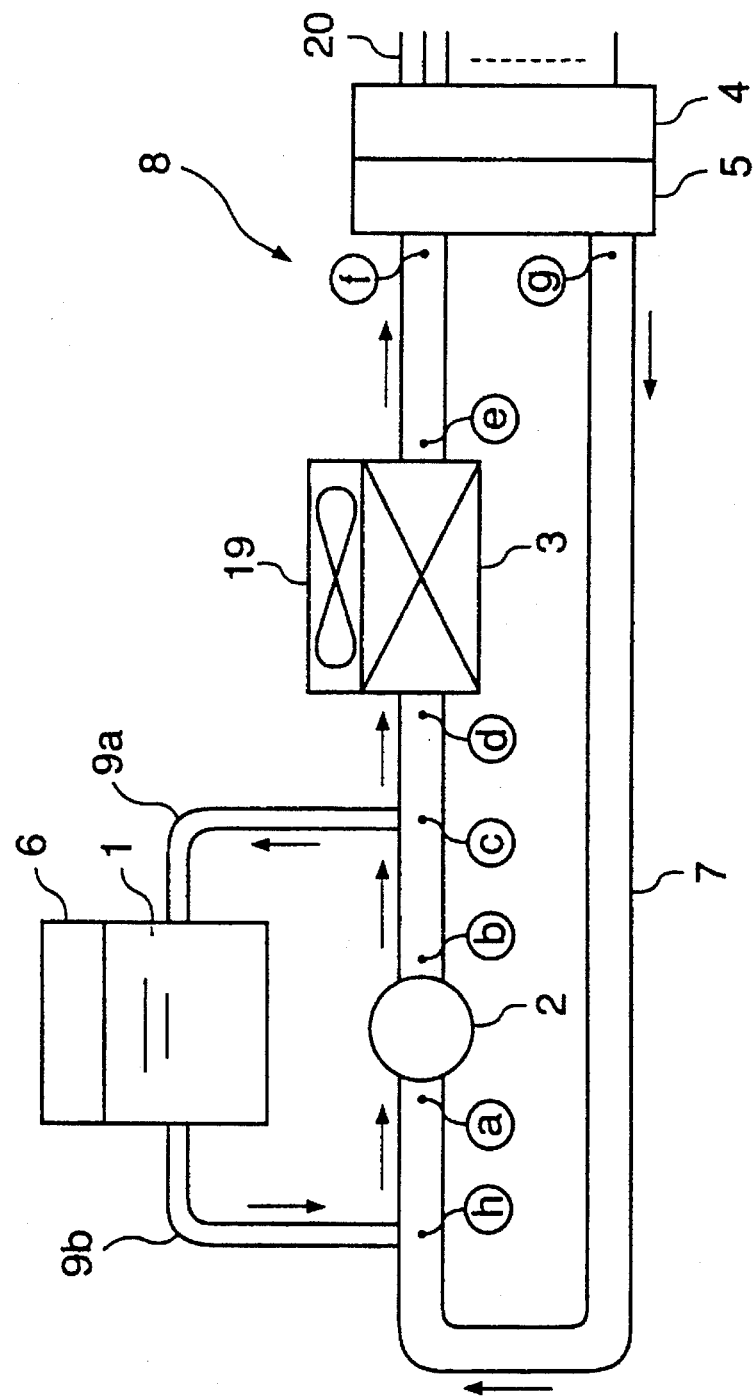
FIG. 3 is a diagram of a cooling system according to a first embodiment of the present invention.

FIG. 3 shows an electronic device cooling system according to a first embodiment of the present invention. In FIG. 3, parts that are the same as those shown in the previously described figures are given the same reference numbers as previously. The circulatory system 8 of the cooling system shown in FIG. 3 includes the pump 2, the heat exchanger 3 and the cooling module 5, which are joined together in this order via the pipe 7.

The tank 6 that reserves the coolant 1 and supplies it to the circulatory system 8 is connected to the circulatory system 8 via bypass channels 9a and 9b respectively connected to pipe 7 of the circulatory system 8 at upstream and downstream connection nodes relatively to the pump 2. More particularly, the bypass channel 9a is connected to a part of the pipe 7 at a first connection node (position c), between an outflow port of the pump 2 and an inflow port of the heat exchange 3, and the bypass channel 9b is connected to a part of the pipe 7 at a second connection node (position h); between the outflow port cooling module 3 and an inflow port of the pump 2. The coolant 1 flows in the circulatory system 8 in directions indicated by arrows shown in FIG. 3. The tank 6 may be of the closed type or the open type.

Figure 4:
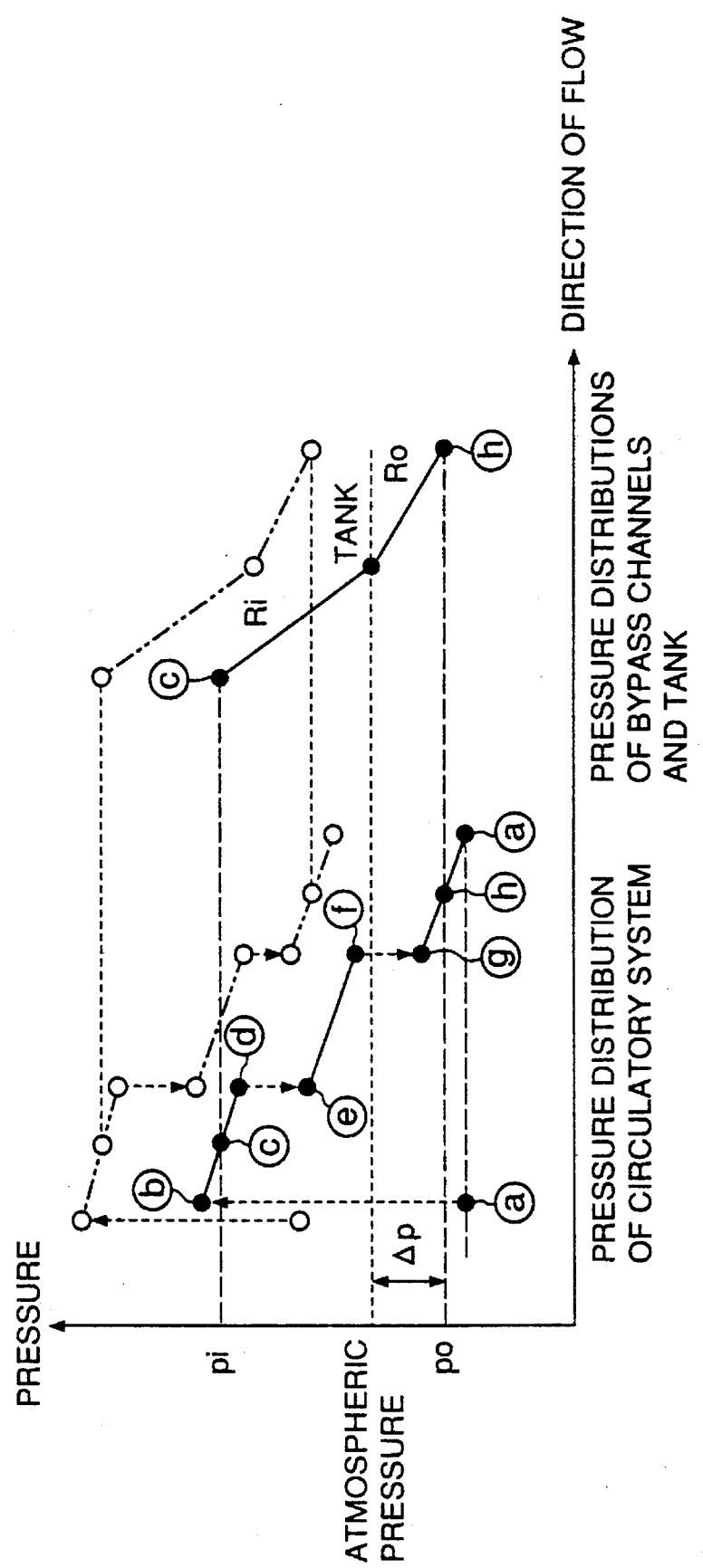
FIG. 4 is a graph of pressure distributions in the cooling system shown in FIG. 3.

FIG. 4 shows pressure distributions in the cooling system shown in FIG. 3 observed when the circulatory system 8 is a closed system. A left-side part of the graph of FIG. 4 indicates a pressure distribution in the circulatory system 8, and a right-side part thereof indicates a pressure distribution in the bypass channels 9a and 9b and the tank 6. The pressure distributions observed in the initial state are indicated by solid lines, and the pressure distributions observed when the electronic device 4 generates heat and hence the temperature of the liquid coolant 1 is raised are indicated by two-dot chained lines. Alphabetic labels shown in FIG. 4 correspond to positions shown in FIG. 3. The characteristics shown in FIG. 4 assume that the vertical positions of the parts of the cooling system shown in FIG. 3 are approximately the same as each other.

The in-tank pressure of the circulatory system 8 can be expressed as follows:

$$\text{(in-tank pressure)} = [Ro/(Ri+Ro)]pi + [Ri/(Ri+Ro)]po \quad (1)$$

where:
Ri: fluid resistance of bypass channel 9a
Ro: fluid resistance of bypass channel 9b
pi: pressure at connection node c
po: pressure at connection node h When Ri=Ro, the in-tank pressure is equal to (pi+po)/2. When Ri>>Ro, the in-tank pressure is equal to po, and the above pressure distribution becomes the same as that of the circulatory system 8 shown in FIG. 1.

The fluid resistances Ri and Ro of the bypass channels 9a and 9b are based on the inner diameters and lengths of the channels and parts provided in the channels, such as valves. Hence, it is possible to equalize a pressure between the pressure pi and the pressure po to the in-tank pressure by adjusting the fluid resistances Ri and Ro.

Hence, when the pressure po is adjusted so as to be Δp lower than the in-tank pressure, the pressure distribution of the circulatory system 8 shown in FIG. 3 becomes lower than that of the circulatory system 8 shown in FIG. 1. Hence, even when the in-tank pressure becomes higher than the atmospheric pressure due to an increase in the temperature of the coolant liquid 1, an increase in the pressure in the circulatory system 8 shown in FIG. 3 with respect to the atmospheric pressure will be smaller than that in the circulatory system 8 shown in FIG. 1.

A quantity Δp of suppression of pressure increase is written as follows:

$$\Delta p = \text{(in-tank pressure)} - po \quad (2)$$
$$= [Ro/(Ri+Ro)](pi-po)$$

In this case, if the pressure po is excessively lower than the in-tank pressure, the pressure at the inflow port of the pump 2 will become excessively low and a cavitation will occur in the pump 2. With the above in mind, the quantity Δp of suppression of pressure increase is determined within a range in which the above problem does not occur.

The flow rate of the coolant flowing in the bypass channel is varied on the basis of the value of the sum (Ri+Ro). As is seen from equation (2), the value of the above sum can be arbitrarily set without changing the quantity Δp of suppression of pressure increase (because Δp is influenced by only the ratio of Ri and Ro).

Though the above description is related to the closed system, the pressure in the circulatory system 8 can also be suppressed in the open system exposed to the atmosphere. For example, a pressure applied to the cooling module 5 shown in FIG. 3 is lower than that applied thereto shown in FIG. 1.

Figure 5:
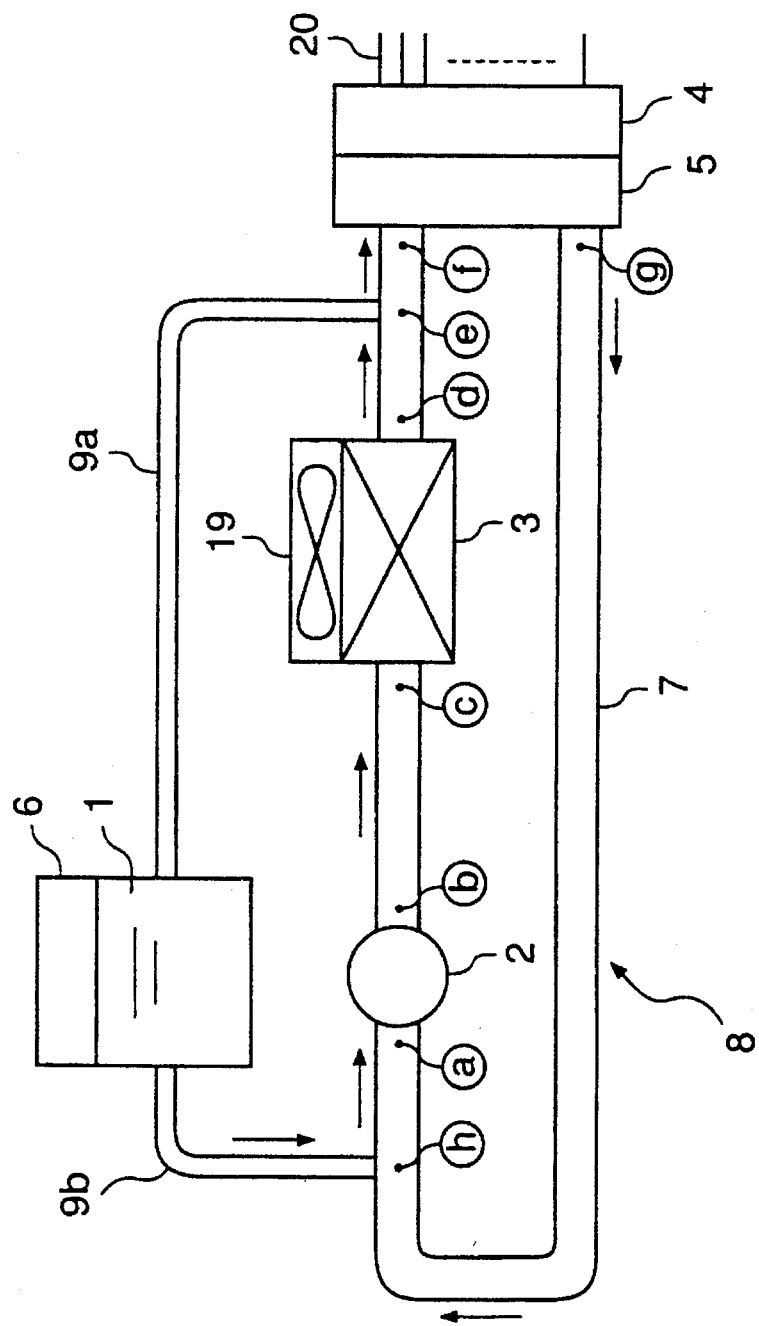
FIG. 5 is a diagram of a cooling system according to a second embodiment of the present invention.

A description will now be given of a second embodiment of the present invention by referring to FIG. 5 in which parts that are the same as those shown in the previously described figures are given the same reference numbers. Referring to FIG. 5, the inflow-side bypass channel 9a is branched from a part of the pipe 7 between the heat exchanger 3 and the cooling module 5.

Figure 6:
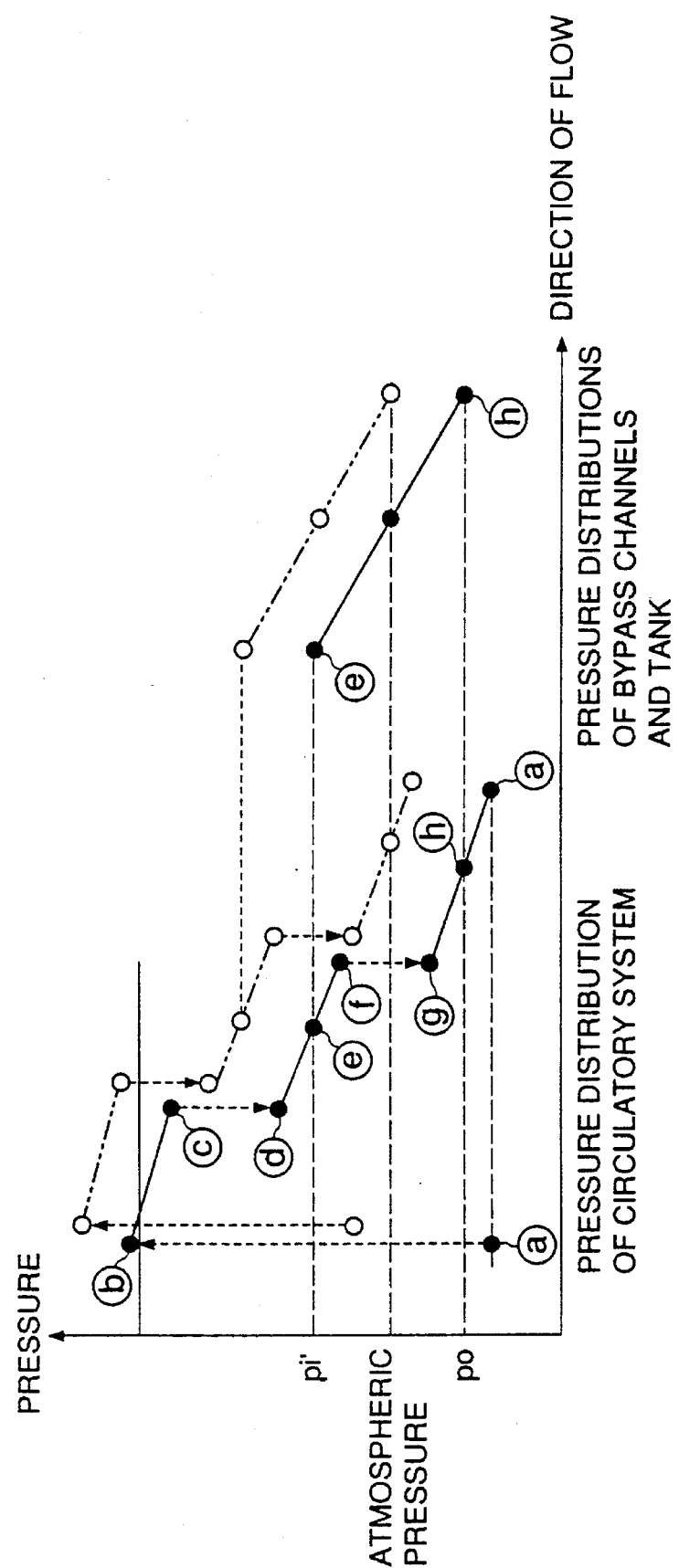
FIG. 6 is a graph of pressure distributions in the cooling system shown in FIG. 5.

FIG. 6 shows pressure distributions in the circulatory system 8 shown in FIG. 5, which are similar to those of the first embodiment shown in FIG. 4. However, an increase in the in-tank pressure according to the second embodiment is less than that according to the first embodiment. This is because, even if the temperature of the coolant liquid 1 rises, the tank 6 is filled with the coolant 1 of a relatively low temperature immediately after passing through the heat exchanger 3.

The above advantage of the second embodiment of the present invention can be obtained irrespective of whether the circulatory system 8 is of the closed type or the open type. Particularly, an additional advantage will be obtained for the open system in that the coolant 1 is prevented from being evaporated and scattered because the temperature in the tank 6 according to the second embodiment can be suppressed to a temperature lower than that according to the first embodiment.

Figure 7:
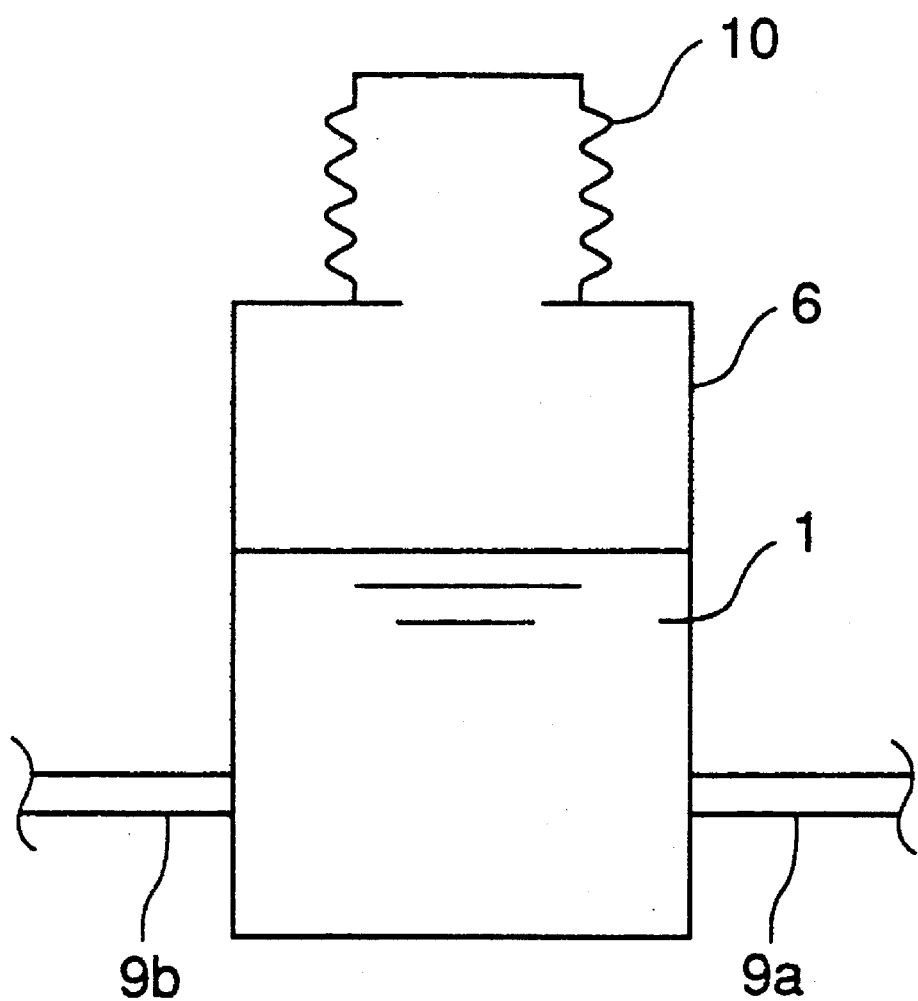
FIG. 7 is a diagram of a variation of a tank used in the first and second embodiments of the present invention.

FIG. 7 shows a variation of the tank 6 used in the aforementioned first and second embodiments of the present invention. The variation shown in FIG. 7 is effective in, particularly, the closed system. The tank 6 shown in FIG. 7 has an elastic movable part 10 formed with bellows. The content volume of the tank 6 shown in FIG. 7 is changed according to the pressure in the tank 6. Instead of bellows, it is possible to form the elastic movable part 10 with a rubber film, an accumulator, or the like. The elastic movable part 10 is not limited to the position shown in FIG. 7 but can be provided in any position in the tank 6.

Figure 8:
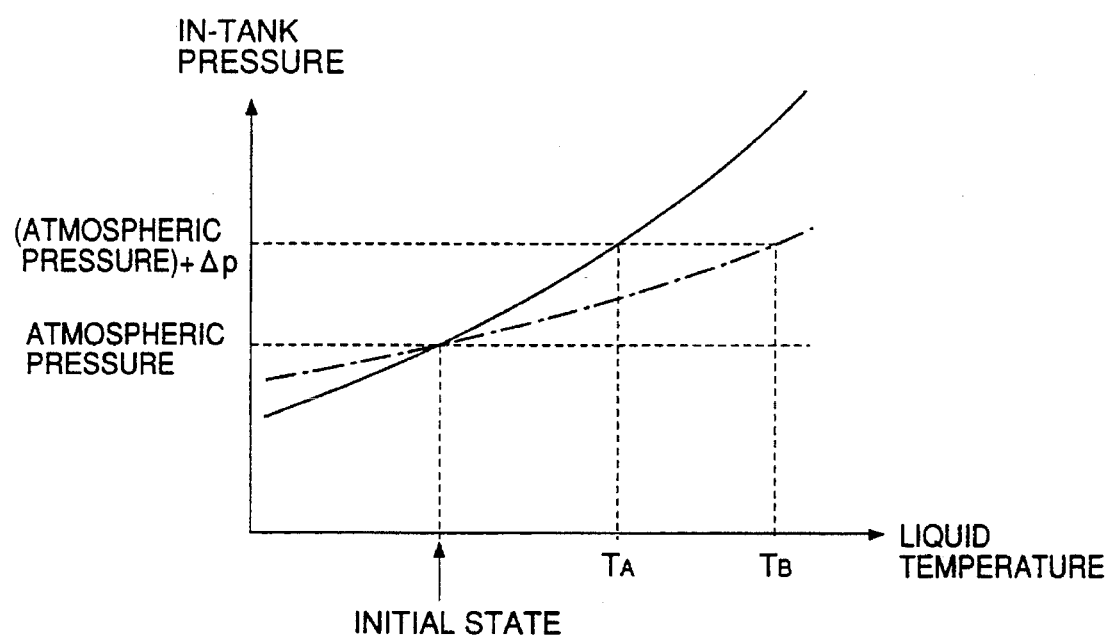
FIG. 8 is a graph indicating the effect of an elastic movable part of the tank shown in FIG. 7.

FIG. 8 indicates the effect of the elastic movable part 10. In a graph of FIG. 8, a solid line indicates a pressure/liquid (coolant) temperature characteristic of the cooling system having the tank 6 shown in FIG. 3 or FIG. 5, and a one-dot chained line indicates a pressure/liquid (coolant) temperature characteristic of the cooling system having the tank 6 shown in FIG. 7. As shown in FIG. 8, the pressure in the closed system varies due to a temperature variation of the liquid coolant 1, which causes a variation in the vapor pressure of the coolant 1. As the temperature of the liquid coolant 1 rises, the pressure in the closed system is gradually increased. An increase in the pressure in the closed system increases the content volume of the elastic movable part 10, whereby the variation in the in-tank pressure can be reduced. The temperature of the liquid coolant 1 is increased to TA with respect to the quantity $\Delta p$ of suppression of pressure increase in the case where the tank 6 does not have the elastic movable part 10. At temperature TA, the effect of suppressing an increase in the in-tank pressure is canceled. Meanwhile, the temperature of the liquid coolant 1 is increased to TB with respect to the quantity of suppression of pressure increase $\Delta p$ in the case where the tank 6 is equipped with the elastic movable part 10. That is, an increase in the in-tank pressure can be suppressed within a broader temperature range (between the temperature of the coolant 1 in the initial state and temperature TB) by means of the tank 6 shown in FIG. 7.

Figure 9:
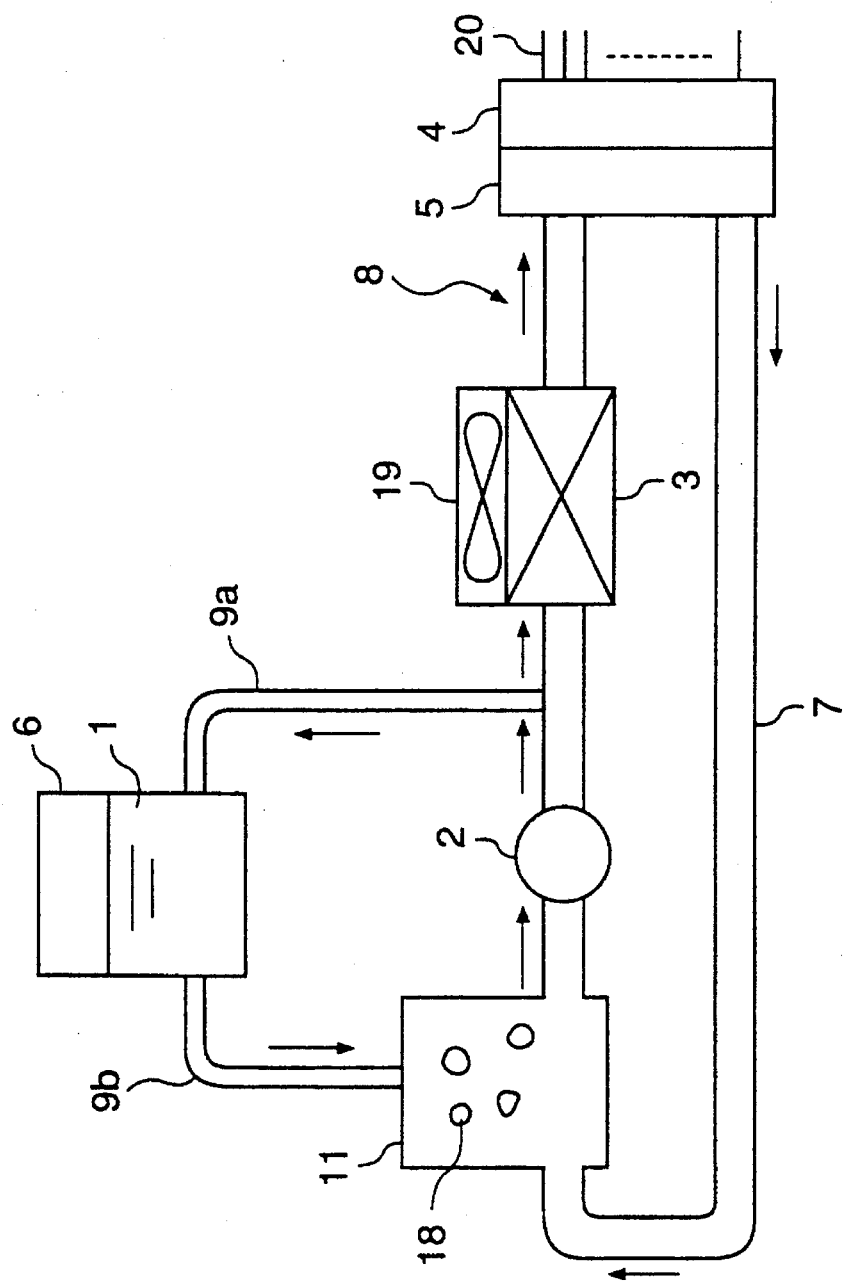
FIG. 9 is a diagram of a variation of the first embodiment of the present invention.

FIG. 9 shows a variation of the first embodiment of the present invention shown in FIG. 3. In FIG. 9, parts that are the same as those shown in the previously described figures are given the same reference numbers as previously. A liquid reservoir 11 is provided at the connection node where the outflow-side bypass channel 9b and the circulatory system 8 are joined together. The outflow bypass channel 9b is joined to an upper part of the reservoir 11. With this structure, the speed of flow of the coolant 1 in the circulatory system 8 shown in FIG. 9 is decreased in the reservoir 11, so that separation of bubbles 18 from the circulated coolant 1 can be facilitated. The bubbles 18 are generated due to, for example, boiling of the coolant in the cooling module 5. Hence, an operation of purging air can be easily performed when the coolant 1 is poured in the circulatory system 8.

It is desirable that the outflow-side bypass channel 9b has a structure making it possible to smoothly move the bubbles 18 to the tank 6 without staying in the channel 9b. The structure of the bypass channel 9b shown in FIG. 9 satisfies the above desire.

Figure 10:
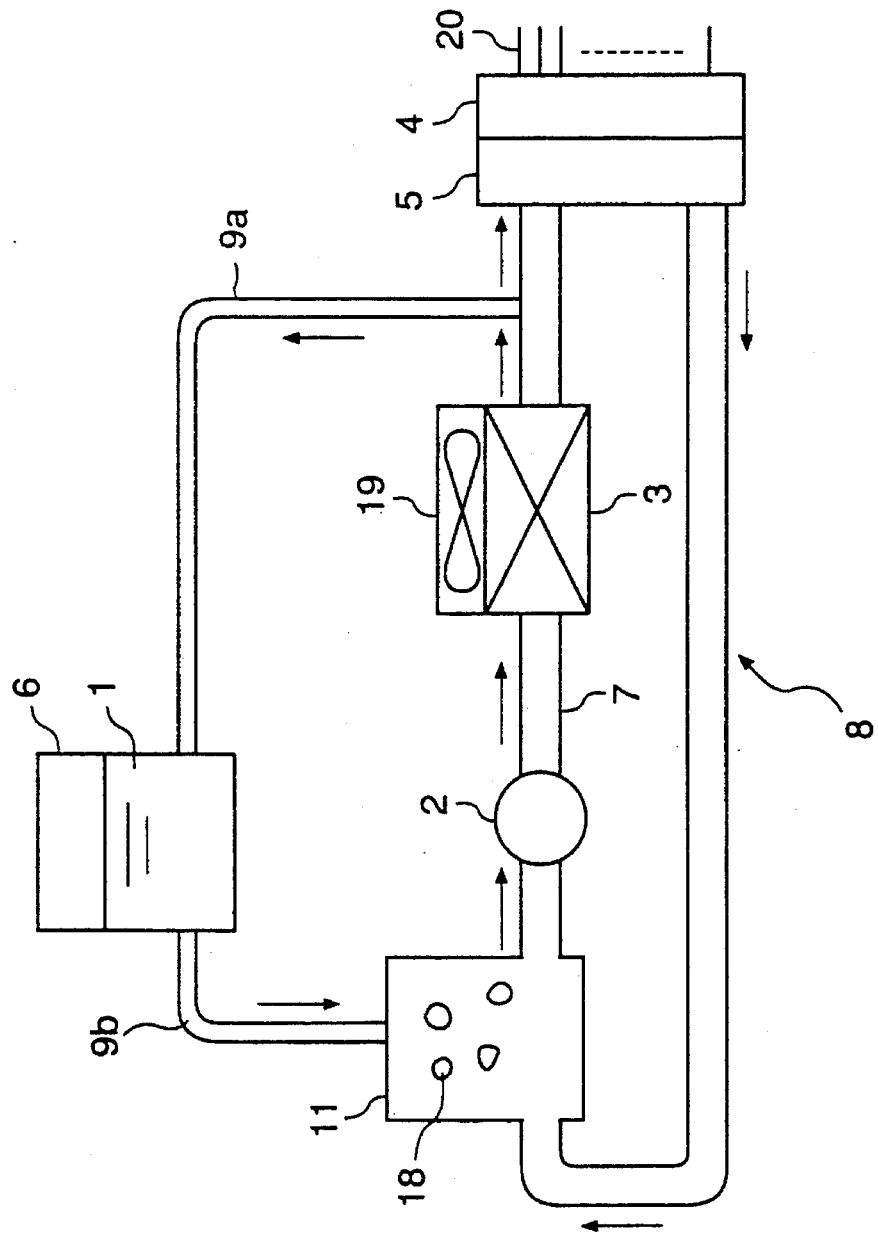
FIG. 10 is a diagram of a variation of the second embodiment of the present invention.

FIG. 10 shows a variation of the second embodiment of the present invention shown in FIG. 5. In FIG. 10, parts that are the same as those shown in the previously described figures are given the same reference numbers as previously. The above-mentioned reservoir 11 is added to the structure shown in FIG. 5 in the same manner as the reservoir 11 shown in FIG. 9. The reservoir 11 shown in FIG. 10 provides the same advantages as described above.

Figure 11:
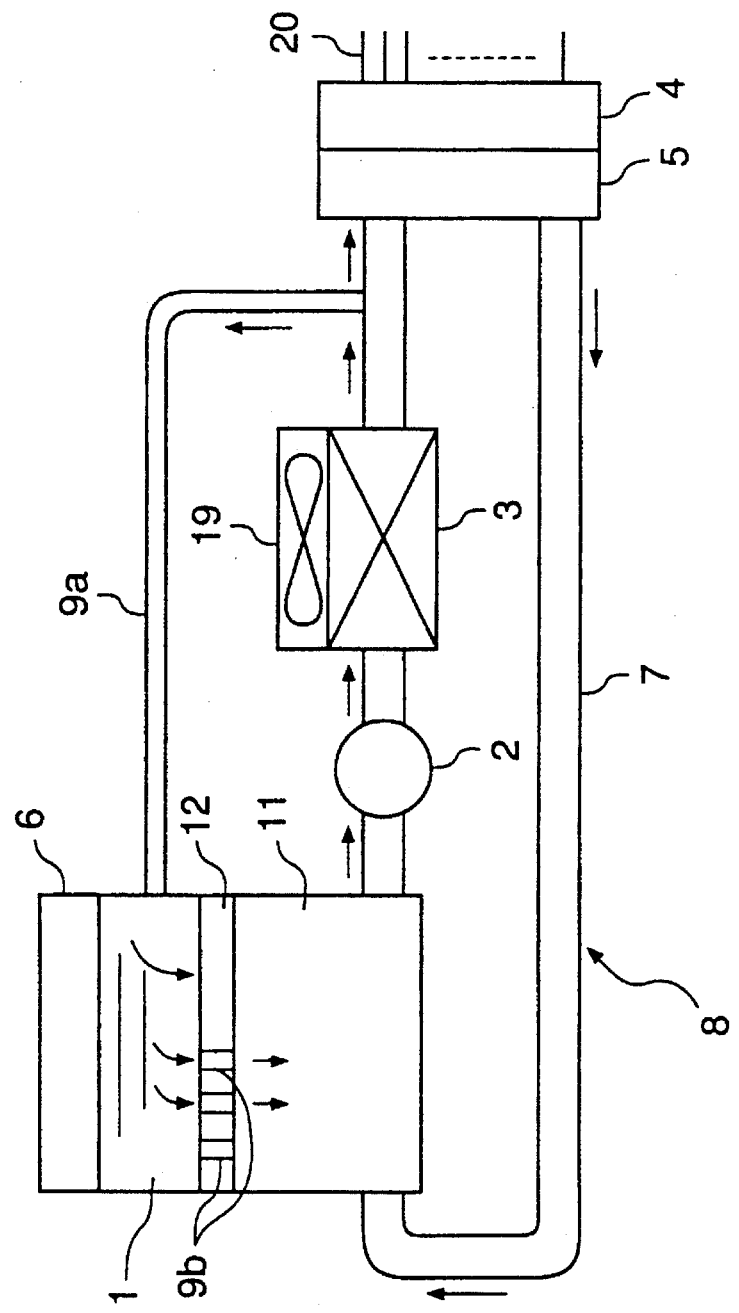
FIG. 11 is a diagram of a variation of the structure shown in FIG. 10.

FIG. 11 shows a variation of the structure shown in FIG. 10. Referring to FIG. 11, the tank 6 and the reservoir 11 are positioned so as to be close to each other via a partition member 12. The partition member 12 has through holes that function as the outflow-side bypass channel 9b. In FIG. 11, the shape, number and arrangement of through holes formed in the partition member 12 can be arbitrarily determined. It is possible to employ a cellular member in which flow channels are repeatedly branched and joined in the partition member 12.

Figure 12:
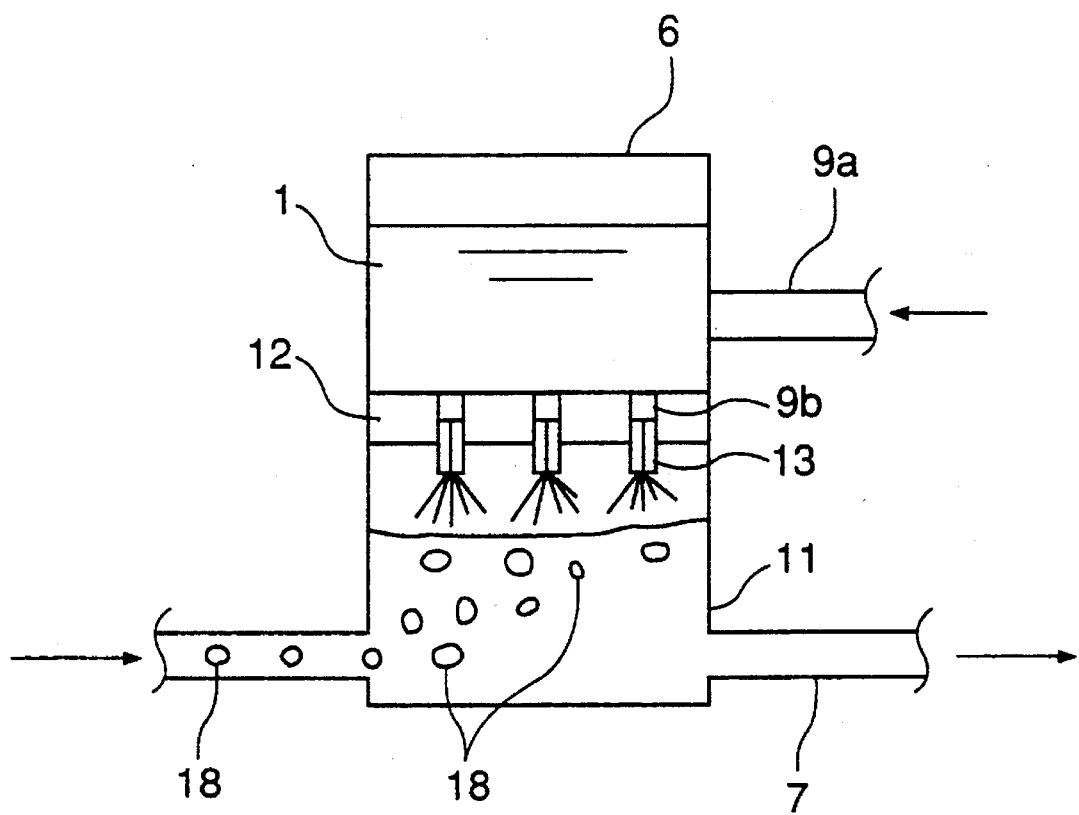
FIG. 12 is a diagram of a variation of the tank used in the structure shown in FIG. 11.

As shown in FIG. 12, nozzles 13 for injecting the coolant 1 are provided in the through holes formed in the partition member 12. The coolant 1 in the tank 6 is fed to the reservoir 11 via the nozzles 13. Use of the nozzles 13 facilitates contact between the bubbles 18 and the coolant 1 of a low temperature in the tank 6 and the function of heat exchange therebetween.

Figure 13:
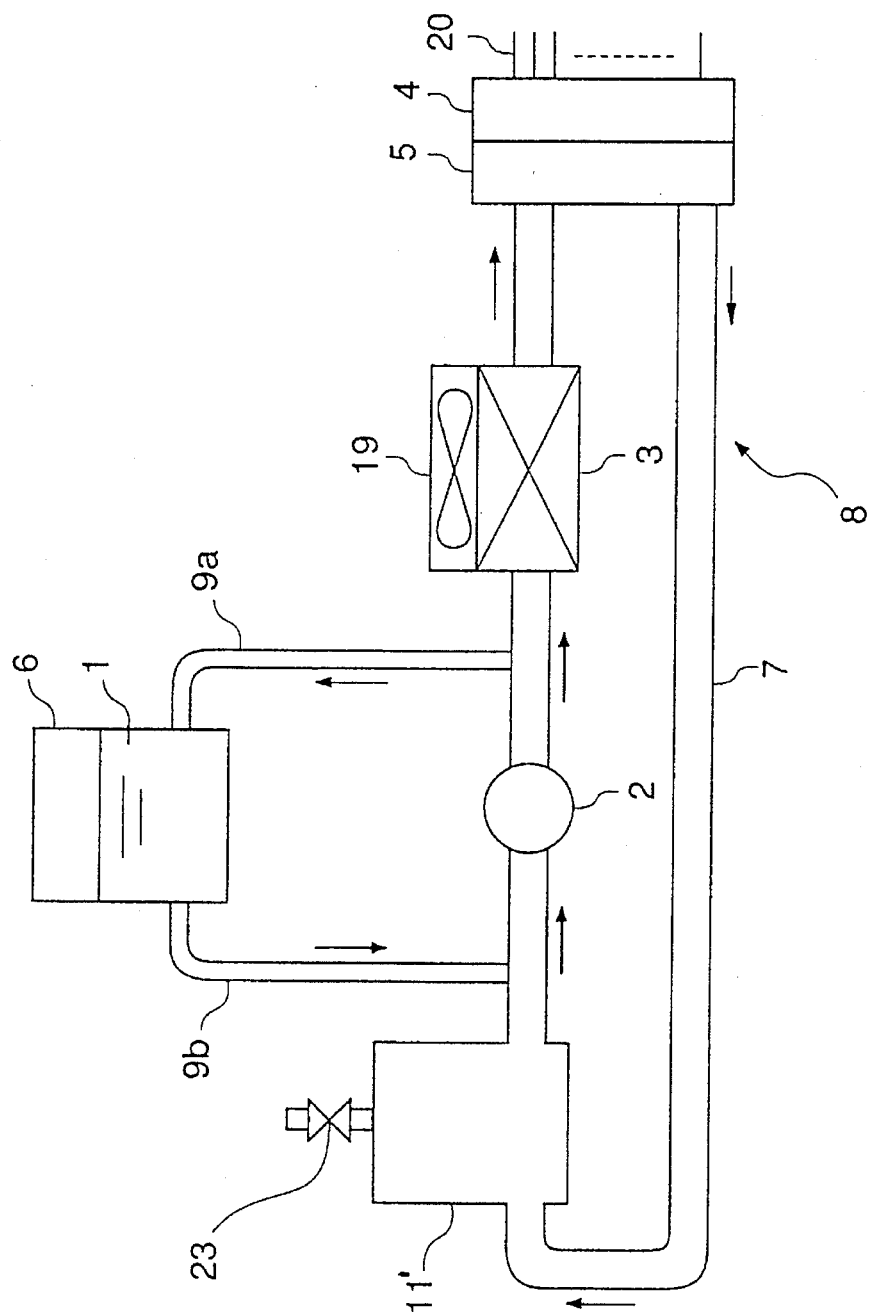
FIG. 13 is a diagram of still another variation of the first embodiment of the present invention.

It is also possible to use an arrangement shown in FIG. 13, in which those parts that are the same as those shown in the previously described figures are given the same reference numbers as previously. The reservoir 11 is provided in a part of the pipe 7 between the cooling module 5 and the pump 2. A vent valve 23 is attached to the upper part of the reservoir 11. The speed of flow of the coolant 1 in the circulatory system 8 is reduced in the reservoir 11, so that separation of the bubbles 18 from the circulated liquid coolant 1 can be facilitated.

The vent valve 23 for releasing the bubbles 18 to the atmosphere can be a manual vent valve manually operated as necessary, or an automatic vent valve that automatically releases only the bubbles 18 due to a density difference between gas and liquid. A counter-flow preventing valve for preventing air from being sucked into the reservoir 11 can be used in series with the valve 23, in a case where the pressure in the reservoir 11 may become lower than the atmospheric pressure even taking into consideration a gravitational pressure due to the level difference between the tank 6 and the valve 23.

FIG. 13 shows the valve 23 applied to the structure in which the reservoir 11 is added to the first embodiment of the present invention shown in FIG. 3. It is also possible to apply the valve 23 to the structure in which the reservoir 11 is added to the second embodiment of the present invention shown in FIG. 5. In FIG. 13, the reservoir 11 is located on the upstream side of the junction point where the bypass channel 9b and the circulatory system 8 are joined together. It is also possible to locate the junction point on the upstream side of the reservoir 11 or to provide the reservoir 11 and the junction point so that the bypass channel 9b is connected to the reservoir 11.

Figure 14:
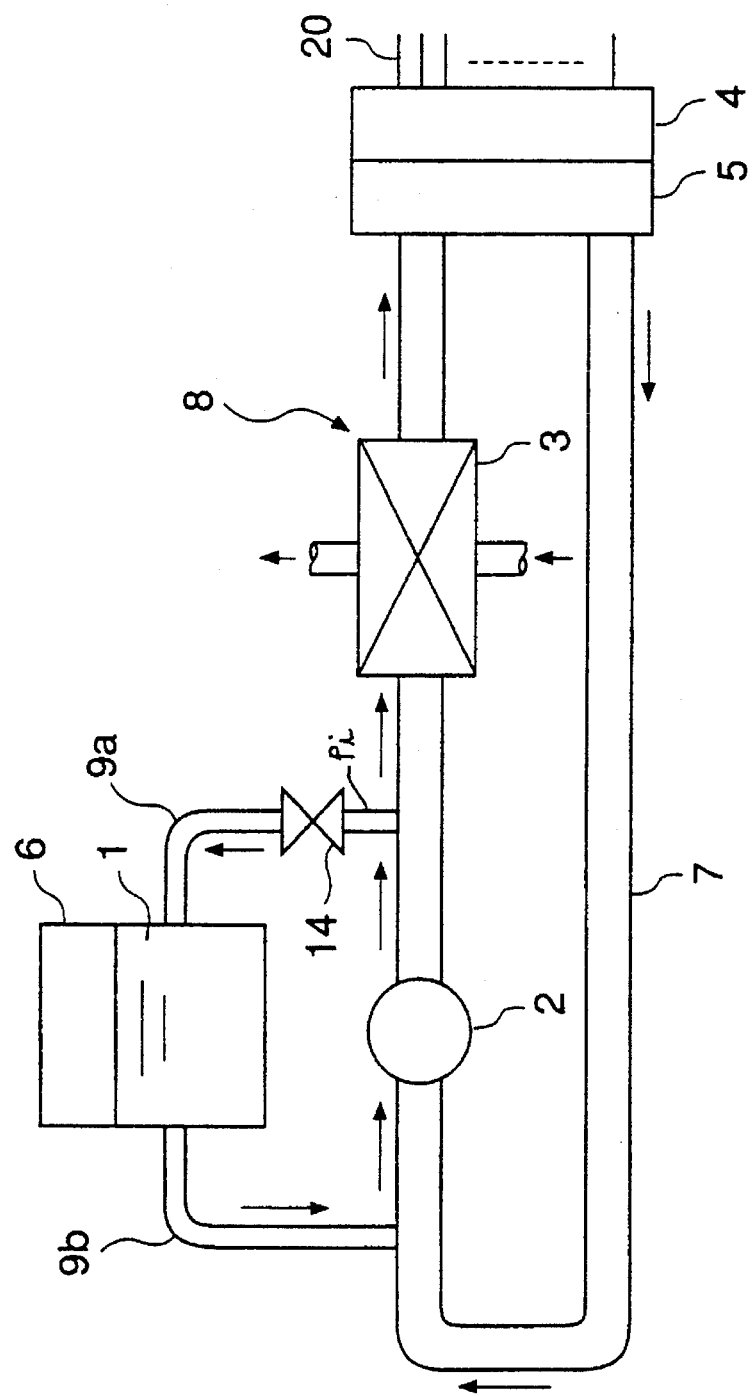
FIG. 14 is a diagram of a cooling system according to a third embodiment of the present invention.

A description will now be given, with reference to FIG. 14, of a third embodiment of the present invention. In FIG. 14, parts that are the same as those shown in the previously described figures are given the same reference numbers as previously. The circulatory system 8 of the third embodiment shown in FIG. 14 is such that the pressure therein can be appropriately adjusted. A relief valve 14 is provided in the inflow-side bypass channel 9a. The relief valve 14 opens when the pressure pi at the connection node c where the inflow-side bypass channel 9a and the circulatory system 8 are joined together, reaches a valve actuating level. At this time, the coolant 1 can flow to the tank 6, and the pressure in the circulatory system 8 is determined as follows.

Figure 15:
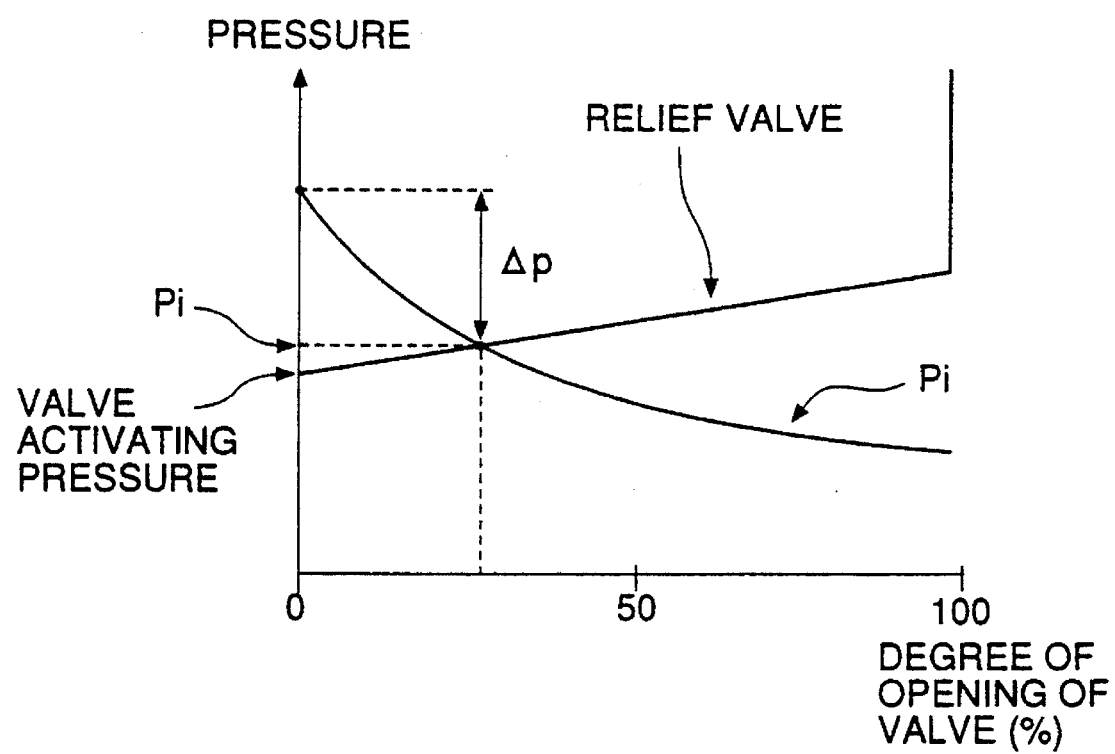
FIG. 15 is a graph indicating the operation of a relief valve shown in FIG. 14.

The pressure pi is increased due to an increase in the temperature of the liquid coolant 1. When the pressure pi at the connection node c exceeds the valve actuating level, the relief valve 14 starts to be opened and the degree of opening of the relief valve 14 is increased along a pressure/degree-of-opening characteristic line shown in FIG. 15. As the degree of opening of the relief valve 14 is increased, the fluid resistance Ri of bypass channel 9a is reduced. Hence, according to the aforementioned equation (2), the quantity $\Delta p$ of suppression of pressure increase is increased, and the pressure in the circulatory system 8 is decreased along a characteristic curve indicating a change in the pressure pi. Hence, a cross point where the above two characteristic curves cross indicates the actual value of the pressure pi. Hence, the pressure pi is kept close to a valve activating pressure until the degree of opening of the relief valve 14 becomes 100%.

The tank 6 used in the third embodiment of the present invention can be of the closed type or the open type. The bypass channels 9a and 9b used in the third embodiment of the present invention are connected to the circulatory system 8 in the same manner as those used in the first embodiment thereof. In an alternative of the third embodiment of the present invention, the bypass channels 9a and 9b can be connected to the circulatory system 8 in the same manner as those used in the second embodiment thereof.

Figure 16:
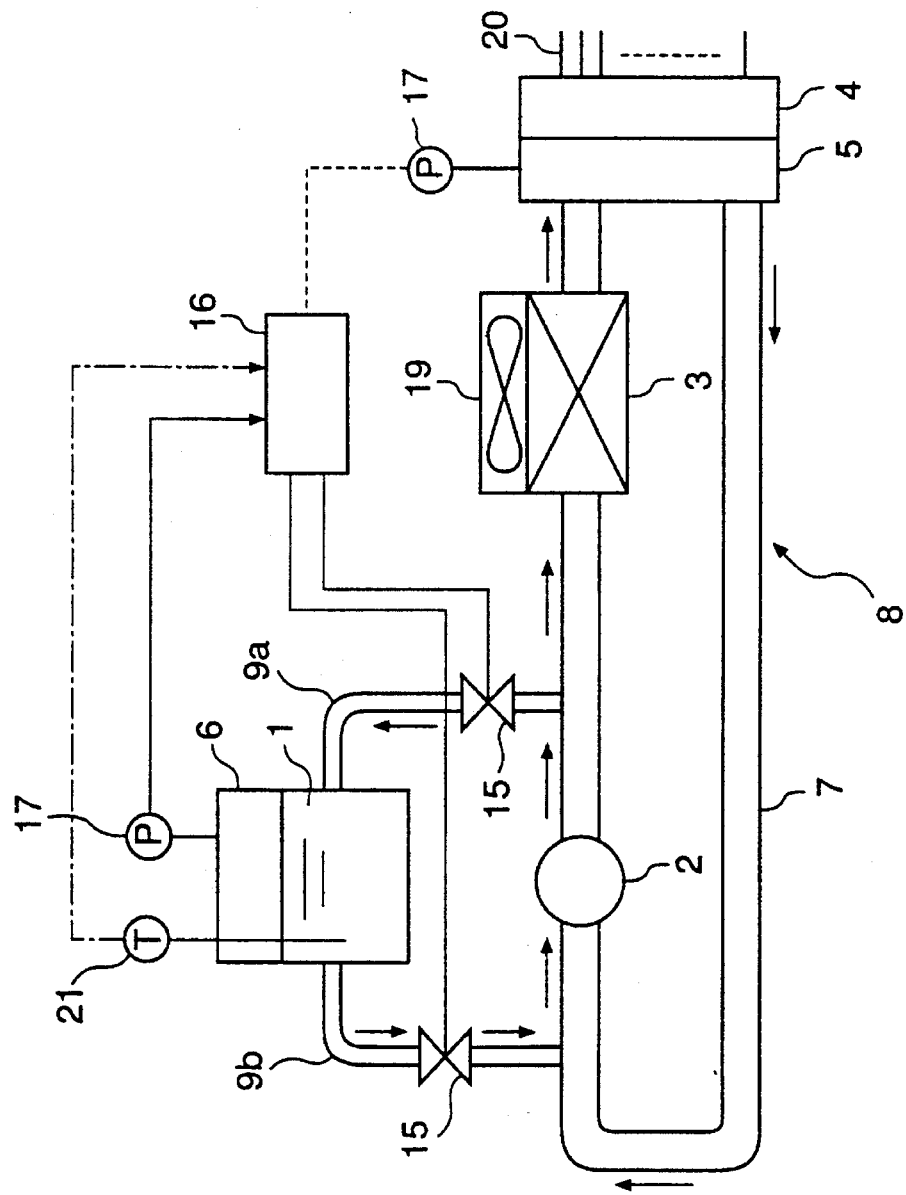
FIG. 16 is a diagram of a cooling system according to a fourth embodiment of the present invention.

A description will now be given, with reference to FIG. 16, of a fourth embodiment of the present invention. In FIG. 16, parts that are the same as those shown in the previously described figures are given the same reference numbers as previously. Two adjustment valves 15 under control of a controller 16 are provided in the bypass channels 9a and 9b connecting the tank 6 and the circulatory system 8 together. Further, a pressure sensor 17 for measuring the in-tank pressure is provided to the tank 6.

Figure 17:
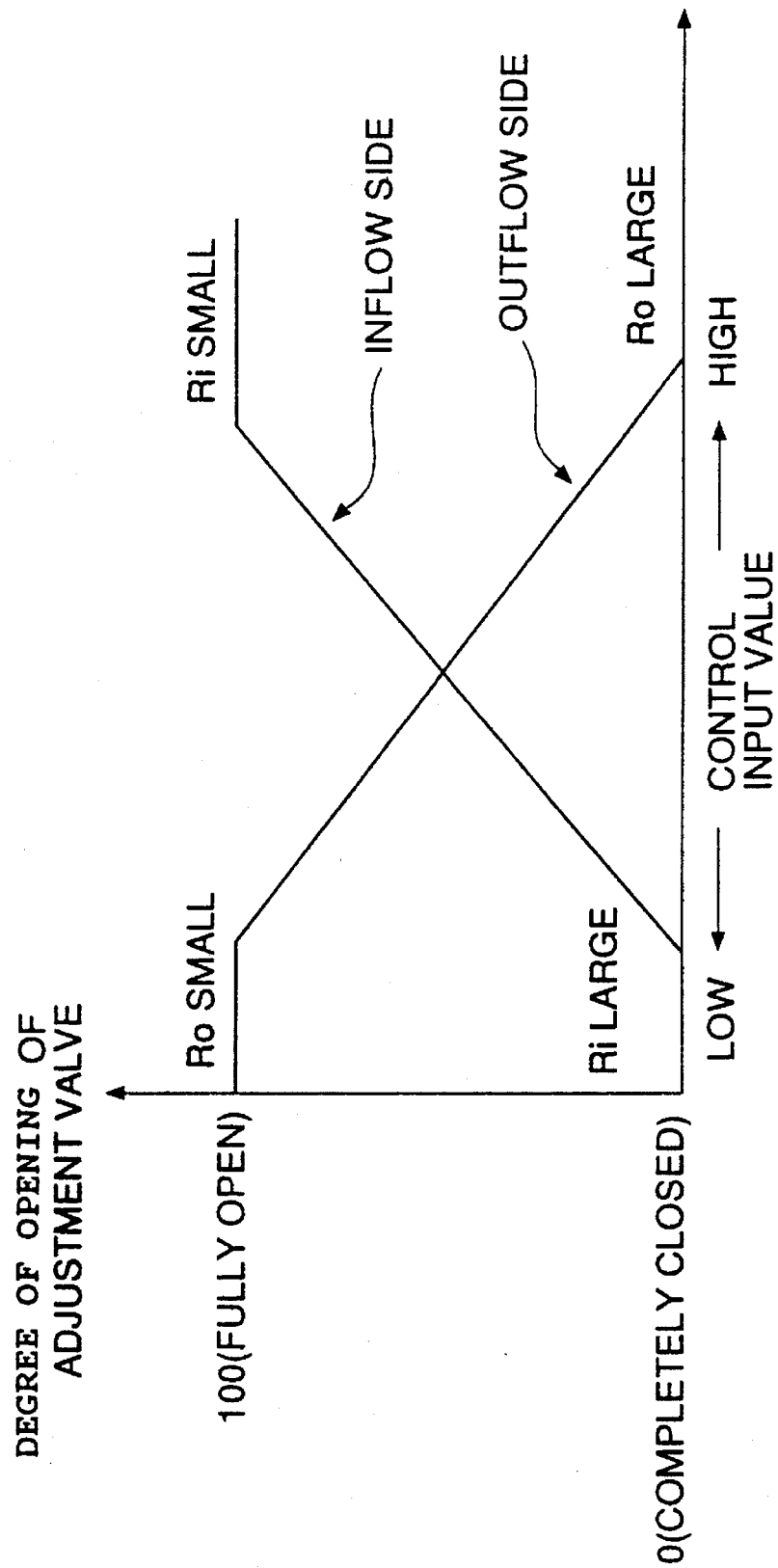
FIG. 17 is a graph indicating the operation of adjustment valves shown in FIG. 16.

FIG. 17 shows the states of the adjustment valves 15 controlled by the controller 16. As a control input from the pressure sensor 17 is increased, the controller 16 reduces the degree of opening of the adjustment valve 15 provided in the outflow-side bypass channel 9b, and increases the degree of opening of the adjustment valve 15 provided in the inflow-side bypass channel 9a. Hence, as the in-tank pressure rises, the fluid resistance Ri of the bypass channel 9a is reduced and the fluid resistance Ro of the bypass channel 9b is increased. Hence, according to the equation (2), the quantity Δp of suppression of pressure increase is increased. Hence, an increase in the pressure in the circulatory system 8 can be canceled by previously determining the detail of the characteristic curves shown in FIG. 17 so that the quantity ΔD is different from the quantity of increase in the in-tank pressure by a constant value. That is, the above condition can be written as follows:

(the quantity of increase in the in-tank pressure)+Δpo=Δp (3)

where Δpo is a constant indicating a quantity of suppression of pressure increase obtained in the initial state.

The equation (3) can be modified as follows, taking into account that the quantity of increase in the in-tank pressure is equal to the difference between the in-tank pressure and the atmospheric pressure and the equation (2):

(in-tank pressure)−(atmospheric pressure)+Δpo=[Ro/(Ri+Ro)](pi−po) (4)

Further, the equation (4) can be rewritten as follows:

Ri/Ro=(pi−po)/[(in-tank pressure)− (atmospheric pressure)+Δpo]−(5)

The value of (pi−po) corresponds to the difference between two points in the circulatory system 8, and is thus constant. Hence, fluid resistance Ri of the bypass channel 9a and the fluid resistance Ro of the bypass channel 9b are determined so that the ratio Ri/Ro is equal to the right side of the equation (5), in which the value of the in-tank pressure is inserted. Then, the degrees of opening of the control valves 15 corresponding to the determined resistance values Ri and Ro are calculated and expressed in the form of characteristic curves as shown in FIG. 17. In this manner, the condition defined by the equation (3) can be satisfied.

It is possible to use either the valve 15 provided in the bypass channel 9a or the valve 15 provided in the bypass channel 9b. Further, information which is to be applied to the controller 16 may be an output signal of a liquid temperature sensor 21 fastened to the tank 6, as indicated by a one-dot chained line shown in FIG. 16. There is a correlation between the temperature of the liquid coolant 1 in the tank 6 and the in-tank pressure, as shown in FIG. 8.

It is also possible to operate the degrees of opening of the valves 15 on the basis of the pressure detected by the pressure sensor 17 provided in the circulatory system 8, as indicated by a dot-chained line shown in FIG. 16. In this manner, it is possible to operate the degrees of opening of the valves 15 so, that the pressure detected by the pressure sensor 17 is constant even when the tank 6 is of the closed type or the open type. When only the valve 15 provided in the inflow-side bypass channel 9a is operated, the controller 16 operates according to a sequence shown in FIG. 18.

Figure 18:
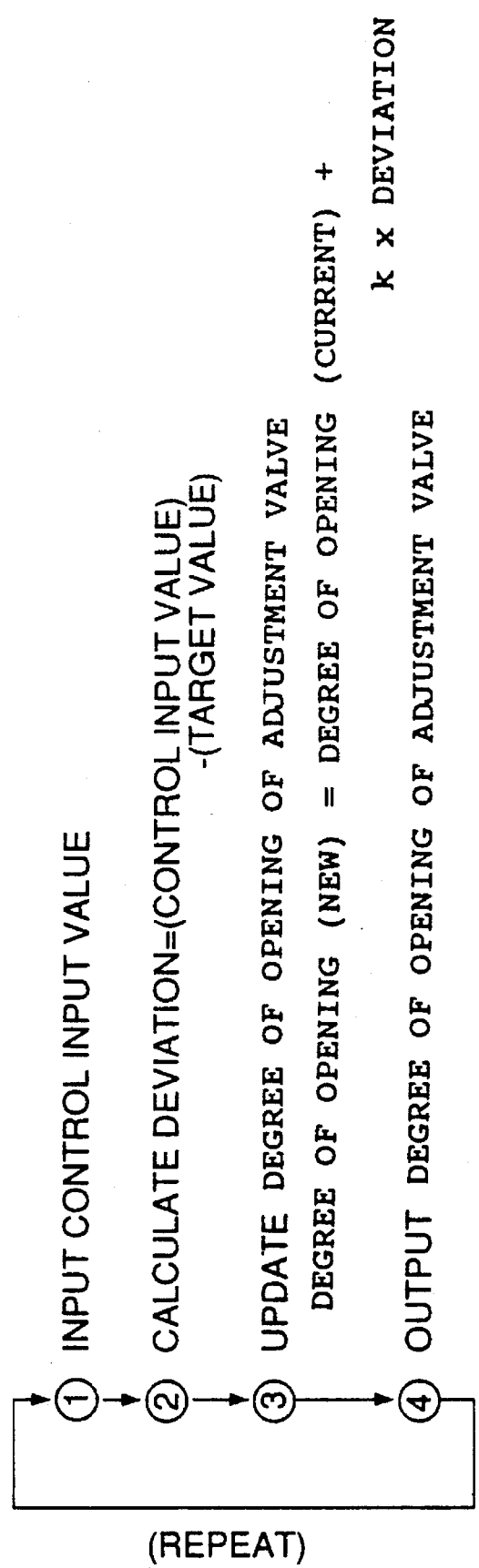
FIG. 18 is a diagram of the operation of a controller shown in FIG. 16.

In FIG. 18, a symbol "k" is a control parameter (proportional gain) having a positive value, and is determined as appropriate for the system. It is possible to employ a control scheme giving a better responsiveness and stability, such as PID control.

The bypass channels 9a and 9b used in the fourth embodiment of the present invention are connected to the circulatory system 8 in the same manner as those used in the first embodiment thereof. In an alternative of the fourth embodiment of the present invention, the bypass channels 9a and 9b can be connected to the circulatory system 8 in the same manner as those used in the second embodiment thereof.

Figure 19:
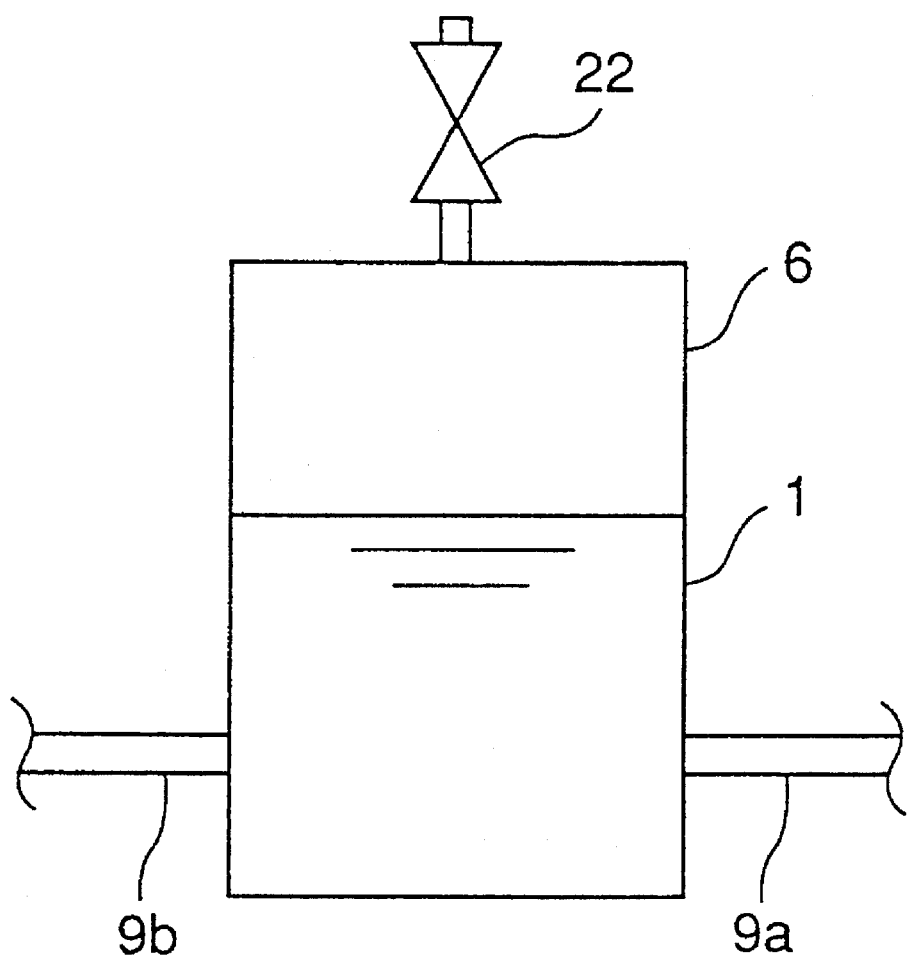
FIG. 19 is a diagram of still another variation of the tank.

FIG. 19 shows another variation of the tank 6. The variation shown in FIG. 19 is effective in, particularly the closed circulatory system. A second relief valve 22 is provided to the tank 6. The second relief valve 22 opens a channel from the tank 6 to the outside thereof (i.e., to the exterior, or ambient, surroundings) when the pressure in the tank 6 reaches a predetermined level. More particularly, in the first through fourth embodiments of the present invention, the quantity Δp of suppression of pressure increase is not infinitely increased, but is limited to (pi−po), as indicated by the equation (2). Hence if the in-tank pressure is abnormally increased due to a temperature increase of the liquid coolant 1 caused by, for example, a failure of the fan 19, an excessive pressure will be applied to the circulatory system 8. In such a case, gas is emitted to the outside of the tank 6 via the second relief valve 22, and hence the in-tank pressure is decreased. In this manner, an excessive pressure increase in the circulatory system 8 can be prevented.

It will be noted that the present invention includes both the closed system and the open system. Further, the heat exchanger 3 can be of a liquid-cooled type as shown at 3' in FIG. 14 or an air-cooled type as shown at 3 in FIG. 3, for example.

The present invention is not limited to the specifically disclosed embodiments, and variations and modifications may be made without departing form the scope of the present invention.

What is claimed is:

1. A cooling system for an electronic device, comprising:
   a circulatory system comprising a pump, the pump having a pump input and a pump output, for circulating a coolant in the circulatory system, a heat exchanger for cooling the coolant and a cooling module for cooling the electronic device by the coolant;
   a tank for reserving the coolant;
   an inflow bypass channel connected in the circulatory system between the tank and a first connection node positioned between the pump output and the cooling module; and an outflow bypass channel connected in the circulatory system between the tank and a second connection node positioned between the cooling module and the pump input.

2. The cooling system as claimed in claim 1, wherein the tank comprises an elastic movable part having a variable volume based on a pressure in the tank.

3. The cooling system as claimed in claim 1, further comprising a reservoir at the second connection node, at which the outflow bypass channel is connected to the circulatory system, the outflow bypass channel being connected to an upper portion of the reservoir.

4. The cooling system as claimed in claim 1, wherein the first connection node is located between the heat exchanger and the cooling module.

5. The cooling system as claimed in claim 4, further comprising a reservoir provided at the second connection node, the outflow bypass channel being connected to a reservoir inlet at an upper portion of the reservoir.

6. The cooling system as claimed in claim 5, wherein the outflow bypass channel comprises a partition member located between the tank and the reservoir having through holes therein providing fluid flow connections between the tank and the reservoir.

7. The cooling system as claimed in claim 5, wherein the outflow bypass channel further comprises a nozzle for injecting the coolant as a spray into the reservoir.

8. The cooling system as claimed in claim 6, wherein the partition member comprises nozzles which receive the coolant which flows through the through holes and inject the received coolant as a spray into the reservoir.

9. The cooling system as claimed in claim 1, further comprising:

a reservoir connected in the circulatory system at a position between the cooling module and the pump; and a valve connected to an upper portion of the reservoir and selectively operable for exhausting gas in the tank to the atmosphere.

10. The cooling system as claimed in claim 1, further comprising a valve connected in the inflow bypass channel which is opened when a pressure in the circulatory system exceeds a predetermined level.

11. The cooling system as claimed in claim 1, further comprising:

a valve connected in one of the inflow bypass channel and the outflow bypass channel; and control means for controlling the valve as a function of a temperature of the coolant in the tank.

12. The cooling system as claimed in claim 1, further comprising:

a valve connected in one of the inflow bypass channel and the outflow bypass channel; and control means for controlling the valve on the basis of a pressure in the tank.

13. The cooling system as claimed in claim 1, further comprising:

a valve connected in one of the inflow bypass channel and the outflow bypass channel; and control means for controlling the valve on the basis of a pressure in the circulatory system.

14. The cooling system as claimed in claim 1, further comprising:

a valve associated with the tank and selectively operable for exhausting the tank to the atmosphere when a pressure in the tank exceeds a predetermined level.

15. The cooling system as claimed in claim 4, further comprising:

a reservoir connected in the circulatory system at a position between the cooling module and the pump; and a valve connected to an upper portion of the reservoir and selectively operable for exhausting gas in the tank to the atmosphere.

16. The cooling system as claimed in claim 1, further comprising a valve, connected in one of the inflow by-pass channel and the outflow by-pass channel, which is selectively opened when a pressure in the circulatory system exceeds a predetermined level.

17. The cooling system as claimed in claim 1, further comprising:

a valve connected in one of the inflow bypass channel and the outflow bypass channel; and control means for controlling the valve on the basis of a temperature of the coolant in the tank.

18. The cooling system as claimed in claim 1, further comprising:

a valve connected in one of the inflow bypass channel and the outflow bypass channel; and control means for controlling the valve on the basis of a pressure in the tank.

19. The cooling system as claimed in claim 1, further comprising:

a valve connected in one of the inflow bypass channel and the outflow bypass channel; and control means for controlling the valve on the basis of a pressure in the circulatory system.

20. The cooling system as claimed in claim 4, further comprising:

a valve associated with the tank and selectively operable for exhausting the tank to the atmosphere when a pressure in the tank exceeds a predetermined level.

21. The cooling system as claimed in claim 1 wherein the first connection node is between the pump output and the heat exchanger.

22. The cooling system as claimed in claim 21, wherein the outflow bypass channel comprises a partition member, located between the tank and the reservoir, having through holes therein providing fluid flow connections between the tank and the reservoir.

23. The cooling system as claimed in claim 21, wherein the outflow bypass channel further comprises a nozzle which injects the coolant as a spray into the reservoir.

24. The cooling system as claimed in claim 22, wherein the partition member comprises nozzles which receive the coolant which flows through the through holes and inject the received coolant as a spray into the reservoir.

25. The cooling system as claimed in claim 1, wherein the first connection node is connected between the pump output and the heat exchanger.

* * * * *

UNITED STATES PATENT AND TRADEMARK OFFICE
CERTIFICATE OF CORRECTION

PATENT NO. : 5,535,818
DATED : July 16, 1996
INVENTOR(S) : FUJISAKI et al.

It is certified that error appears in the above-indentified patent and that said Letters Patent is hereby corrected as shown below:

Col. 3, line 45, after "heat" insert --,--.

Col. 7, line 37, change "AID" to --Δp--;
line 55, the end of the equation should read: --Δpo] - 1     (5)--.

Col. 8, line 14, change "so," to --so--;
line 15, change "17" to --17'--;
line 50, change "3'" to --3--.

Signed and Sealed this

Seventeenth Day of December, 1996

Attest:

BRUCE LEHMAN

Attesting Officer     Commissioner of Patents and Trademarks